US012289861B2

(12) United States Patent
Malouin et al.

(10) Patent No.: US 12,289,861 B2
(45) Date of Patent: Apr. 29, 2025

(54) LIQUID-IN-LIQUID COOLING SYSTEM FOR ELECTRONIC COMPONENTS

(71) Applicant: Jetcool Technologies Inc., Littleton, MA (US)

(72) Inventors: Bernard Malouin, Westford, MA (US); Jordan Mizerak, Belmont, MA (US); Eric Browne, Westford, MA (US)

(73) Assignee: JetCool Technologies Inc., Littleton, MA (US)

( * ) Notice: Subject to any disclaimer, the term of this patent is extended or adjusted under 35 U.S.C. 154(b) by 287 days.

(21) Appl. No.: 17/984,570

(22) Filed: Nov. 10, 2022

(65) Prior Publication Data

US 2023/0156959 A1 May 18, 2023

Related U.S. Application Data

(60) Provisional application No. 63/278,826, filed on Nov. 12, 2021.

(51) Int. Cl.
*H05K 7/20* (2006.01)
*G01F 23/263* (2022.01)

(52) U.S. Cl.
CPC ..... *H05K 7/20272* (2013.01); *H05K 7/20236* (2013.01); *H05K 7/20254* (2013.01); *H05K 7/20263* (2013.01); *G01F 23/263* (2013.01)

(58) Field of Classification Search
CPC ........... H05K 7/20236; H05K 7/20254; H05K 7/20263; H05K 7/20272; G01F 23/263
USPC ....................................................... 363/141
See application file for complete search history.

(56) References Cited

U.S. PATENT DOCUMENTS

| 236,519 | A | 1/1881 | Walsh |
|---|---|---|---|
| 3,765,728 | A | 10/1973 | Peruglia |
| 3,841,671 | A | 10/1974 | Walker |
| 3,980,112 | A | 9/1976 | Basham |
| 4,062,572 | A | 12/1977 | Davis |
| 4,090,539 | A | 5/1978 | Krupp |
| 4,696,496 | A | 9/1987 | Guelis et al. |
| 4,796,924 | A | 1/1989 | Kosugi et al. |
| 4,890,865 | A | 1/1990 | Hosono et al. |

(Continued)

FOREIGN PATENT DOCUMENTS

| CN | 102414813 B | 4/2014 |
|---|---|---|
| CN | 107567247 A | 1/2018 |

(Continued)

OTHER PUBLICATIONS

Celli, "Compressible fluids," retrieved from the Internet: http://galileo.phys.virginia.edu/classes/311/notes/compflu2/node1.html, 1997.

*Primary Examiner* — Yemane Mehari
(74) *Attorney, Agent, or Firm* — Grady L. White; Potomac Law Group, PLLC

(57) ABSTRACT

A cooling system and method of cooling electronic components comprising a tank (or other vessel) in which a dielectric liquid cools low power electronic components within the tank, while a conductive liquid cools high power electronic components in the tank. The conductive liquid is supplied via a plurality of cooling modules, each arranged on or in proximity to a high power component. A cooling module arranged within the tank may enclose one or more of the electronic components in the tank using a fluid-tight seal.

24 Claims, 10 Drawing Sheets

(56) References Cited

U.S. PATENT DOCUMENTS

| | | |
|---|---|---|
| 4,922,971 A | 5/1990 | Grantham |
| 5,021,924 A | 6/1991 | Kieda et al. |
| 5,088,005 A | 2/1992 | Ciaccio |
| 5,249,358 A | 10/1993 | Tousignant et al. |
| 5,263,536 A | 11/1993 | Hulburd et al. |
| 5,285,351 A | 2/1994 | Ikeda |
| 5,309,319 A | 5/1994 | Messina |
| 5,316,075 A | 5/1994 | Quon et al. |
| 5,349,831 A | 9/1994 | Daikoku et al. |
| 5,401,064 A | 3/1995 | Guest |
| 5,491,363 A | 2/1996 | Yoshikawa |
| 5,547,231 A | 8/1996 | Sharp |
| 5,611,373 A | 3/1997 | Ashcraft |
| 5,687,993 A | 11/1997 | Brim |
| 5,720,325 A | 2/1998 | Grantham |
| 5,959,351 A | 9/1999 | Sasaki et al. |
| 5,999,404 A | 12/1999 | Hileman |
| 6,105,373 A | 8/2000 | Watanabe et al. |
| 6,144,013 A | 11/2000 | Chu et al. |
| 6,366,462 B1 | 4/2002 | Chu et al. |
| 6,528,878 B1 | 3/2003 | Daikoku et al. |
| 6,546,951 B1 | 4/2003 | Armenia et al. |
| 6,550,263 B2 | 4/2003 | Patel et al. |
| 6,550,815 B2 | 4/2003 | Zitkowic, Jr. et al. |
| 6,729,383 B1 | 5/2004 | Cannell et al. |
| 6,952,346 B2 | 10/2005 | Tilton et al. |
| 6,973,801 B1 | 12/2005 | Campbell et al. |
| 7,007,506 B2 | 3/2006 | Kubo et al. |
| 7,104,312 B2 | 9/2006 | Goodson et al. |
| 7,149,087 B2 | 12/2006 | Wilson et al. |
| 7,223,494 B2 | 5/2007 | Takeshita et al. |
| 7,233,494 B2 | 6/2007 | Campbell et al. |
| 7,241,423 B2 | 7/2007 | Golbig et al. |
| 7,265,976 B1 | 9/2007 | Knight |
| 7,277,383 B2 | 10/2007 | Campbell et al. |
| 7,511,957 B2 | 3/2009 | Campbell et al. |
| 7,787,248 B2 | 8/2010 | Campbell et al. |
| 7,802,442 B2 | 9/2010 | Bezama et al. |
| 7,866,173 B2 | 1/2011 | Brunschwiler et al. |
| 7,916,483 B2 | 3/2011 | Campbell et al. |
| 7,978,473 B2 | 7/2011 | Campbell et al. |
| 7,992,627 B2 | 8/2011 | Bezama et al. |
| 8,059,405 B2 | 11/2011 | Campbell et al. |
| 8,266,802 B2 | 9/2012 | Campbell et al. |
| 8,824,146 B2 | 9/2014 | Brok et al. |
| 8,912,643 B2 | 12/2014 | Bock et al. |
| 8,929,080 B2 | 1/2015 | Campbell et al. |
| 8,944,151 B2 | 2/2015 | Flotta et al. |
| 8,981,556 B2 | 3/2015 | Joshi |
| 9,165,857 B2 | 10/2015 | Song et al. |
| 9,247,672 B2 | 1/2016 | Mehring |
| 9,252,069 B2 | 2/2016 | Bhunia et al. |
| 9,445,529 B2 | 9/2016 | Chainer et al. |
| 9,484,283 B2 | 11/2016 | Joshi et al. |
| 9,521,787 B2 | 12/2016 | Chainer et al. |
| 9,530,818 B2 | 12/2016 | Stern et al. |
| 9,559,038 B2 | 1/2017 | Schmit et al. |
| 9,560,790 B2 | 1/2017 | Joshi et al. |
| 9,622,379 B1 | 4/2017 | Campbell et al. |
| 9,638,477 B1 | 5/2017 | Choi et al. |
| 9,653,378 B2 | 5/2017 | Hou et al. |
| 9,750,159 B2 | 8/2017 | Campbell et al. |
| 9,852,963 B2 | 12/2017 | Shedd et al. |
| 9,901,008 B2 | 2/2018 | Shedd et al. |
| 9,903,664 B2 | 2/2018 | Joshi |
| 10,031,564 B2 * | 7/2018 | Jia .................. G06F 1/20 |
| 10,078,354 B2 | 9/2018 | Eriksen et al. |
| 10,152,096 B1 | 12/2018 | Chen et al. |
| 10,228,735 B2 | 3/2019 | Kulkarni et al. |
| 10,270,220 B1 | 4/2019 | Eppich et al. |
| 10,285,309 B2 | 5/2019 | James et al. |
| 10,306,802 B1 | 5/2019 | Ditri et al. |
| 10,426,062 B1 | 9/2019 | Saunders |
| 10,473,252 B2 | 11/2019 | Oberdorfer et al. |
| 10,512,152 B2 | 12/2019 | Smith et al. |
| 10,561,040 B1 | 2/2020 | Lunsman et al. |
| 10,651,112 B2 | 5/2020 | Malouin, Jr. et al. |
| 10,665,529 B2 | 5/2020 | Smith et al. |
| 10,903,141 B2 | 1/2021 | Malouin, Jr. et al. |
| 10,985,089 B2 | 4/2021 | Hart et al. |
| 11,018,077 B2 | 5/2021 | Smith et al. |
| 11,096,313 B2 | 8/2021 | Amos et al. |
| 11,322,426 B2 | 5/2022 | Malouin, Jr. et al. |
| 11,439,037 B2 | 9/2022 | Subrahmanyam et al. |
| 11,594,470 B2 | 2/2023 | Smith et al. |
| 11,710,678 B2 | 7/2023 | Ganti et al. |
| 2002/0075651 A1 | 6/2002 | Newton et al. |
| 2002/0113142 A1 | 8/2002 | Patel et al. |
| 2004/0051308 A1 | 3/2004 | Coates |
| 2004/0194492 A1 | 10/2004 | Tilton et al. |
| 2005/0143000 A1 | 6/2005 | Eisele et al. |
| 2005/0210906 A1 | 9/2005 | Laufer et al. |
| 2005/0280994 A1 | 12/2005 | Yazawa |
| 2006/0042825 A1 | 3/2006 | Lu et al. |
| 2006/0250773 A1 | 11/2006 | Campbell et al. |
| 2006/0250774 A1 | 11/2006 | Campbell et al. |
| 2007/0017659 A1 | 1/2007 | Brunschwiler et al. |
| 2007/0091569 A1 | 4/2007 | Campbell et al. |
| 2007/0121294 A1 | 5/2007 | Campbell et al. |
| 2007/0121299 A1 | 5/2007 | Campbell et al. |
| 2007/0221364 A1 | 9/2007 | Lai et al. |
| 2007/0272392 A1 | 11/2007 | Ghosh et al. |
| 2007/0274045 A1 | 11/2007 | Campbell et al. |
| 2007/0295480 A1 | 12/2007 | Campbell et al. |
| 2008/0037221 A1 | 2/2008 | Campbell et al. |
| 2008/0278913 A1 | 11/2008 | Campbell et al. |
| 2009/0013258 A1 | 1/2009 | Hintermeister et al. |
| 2009/0032937 A1 | 2/2009 | Mann et al. |
| 2009/0284821 A1 | 11/2009 | Valentin et al. |
| 2009/0294105 A1 | 12/2009 | Sundararajan et al. |
| 2009/0294106 A1 | 12/2009 | Flotta et al. |
| 2009/0314467 A1 | 12/2009 | Campbell et al. |
| 2009/0316360 A1 | 12/2009 | Campbell et al. |
| 2010/0052714 A1 | 3/2010 | Miller |
| 2010/0276026 A1 | 11/2010 | Powell et al. |
| 2010/0290190 A1 * | 11/2010 | Chester .................. H05K 7/20 |
| | | 174/547 |
| 2010/0328882 A1 | 12/2010 | Campbell et al. |
| 2010/0328888 A1 | 12/2010 | Campbell et al. |
| 2010/0328889 A1 * | 12/2010 | Campbell .............. H05K 7/203 |
| | | 361/699 |
| 2011/0277491 A1 | 11/2011 | Wu et al. |
| 2012/0048515 A1 | 3/2012 | Bhunia et al. |
| 2012/0063091 A1 | 3/2012 | Dede et al. |
| 2012/0160459 A1 | 6/2012 | Flotta et al. |
| 2012/0212907 A1 | 8/2012 | Dede |
| 2014/0085823 A1 | 3/2014 | Campbell et al. |
| 2014/0124167 A1 | 5/2014 | Campbell et al. |
| 2014/0126150 A1 | 5/2014 | Song et al. |
| 2014/0158326 A1 | 6/2014 | Lyon |
| 2014/0190668 A1 | 7/2014 | Joshi et al. |
| 2014/0204532 A1 | 7/2014 | Mehring |
| 2014/0205632 A1 | 7/2014 | Gruber et al. |
| 2014/0264759 A1 | 9/2014 | Koontz et al. |
| 2014/0284787 A1 | 9/2014 | Joshi |
| 2014/0293542 A1 | 10/2014 | Vetrovec |
| 2014/0352937 A1 | 12/2014 | Draht |
| 2015/0043164 A1 | 2/2015 | Joshi |
| 2015/0096722 A1 | 4/2015 | Zweiback et al. |
| 2015/0131224 A1 | 5/2015 | Barina et al. |
| 2015/0208549 A1 | 7/2015 | Shedd et al. |
| 2016/0013115 A1 | 1/2016 | Vadhavkar et al. |
| 2016/0014932 A1 | 1/2016 | Best et al. |
| 2016/0020160 A1 | 1/2016 | Buvid et al. |
| 2016/0120058 A1 | 4/2016 | Shedd et al. |
| 2016/0143184 A1 | 5/2016 | Campbell et al. |
| 2016/0278239 A1 | 9/2016 | Chainer et al. |
| 2017/0092565 A1 | 3/2017 | Chen et al. |
| 2017/0150649 A1 | 5/2017 | Chester et al. |
| 2017/0179001 A1 | 6/2017 | Brunschwiler et al. |
| 2017/0347487 A1 | 11/2017 | Rudnicki et al. |
| 2018/0027695 A1 * | 1/2018 | Wakino ............ H05K 7/20772 |
| | | 361/699 |
| 2018/0040538 A1 | 2/2018 | Schuderer et al. |

(56) References Cited

U.S. PATENT DOCUMENTS

| | | |
|---|---|---|
| 2018/0090417 A1 | 3/2018 | Gutala et al. |
| 2018/0124949 A1 | 5/2018 | Marroquin et al. |
| 2018/0288903 A1* | 10/2018 | Chainer ............ H05K 7/20727 |
| 2019/0013258 A1 | 1/2019 | Malouin, Jr. et al. |
| 2019/0029105 A1 | 1/2019 | Smith et al. |
| 2019/0195399 A1 | 6/2019 | Nguyen et al. |
| 2019/0235449 A1 | 8/2019 | Slessman et al. |
| 2019/0289749 A1 | 9/2019 | Dariavach et al. |
| 2019/0348345 A1 | 11/2019 | Parida et al. |
| 2019/0391170 A1* | 12/2019 | Kochar ................. G06Q 10/10 |
| 2020/0006197 A1 | 1/2020 | Hart et al. |
| 2020/0011620 A1 | 1/2020 | Sherrer et al. |
| 2020/0015383 A1 | 1/2020 | Gao |
| 2020/0027819 A1 | 1/2020 | Smith et al. |
| 2020/0033075 A1 | 1/2020 | Veto et al. |
| 2020/0100396 A1 | 3/2020 | Iyengar et al. |
| 2020/0168526 A1 | 5/2020 | Malouin, Jr. et al. |
| 2020/0214126 A1 | 7/2020 | Nakashima et al. |
| 2020/0253092 A1 | 8/2020 | Chainer et al. |
| 2020/0296862 A1 | 9/2020 | Iyengar et al. |
| 2020/0312746 A1 | 10/2020 | Smith et al. |
| 2020/0328139 A1 | 10/2020 | Chiu et al. |
| 2020/0350231 A1 | 11/2020 | Shen et al. |
| 2021/0134703 A1 | 5/2021 | Malouin, Jr. et al. |
| 2021/0265240 A1 | 8/2021 | Smith et al. |
| 2021/0351108 A1 | 11/2021 | Diglio et al. |
| 2022/0151097 A1 | 5/2022 | McManis et al. |
| 2022/0230937 A1 | 7/2022 | Malouin et al. |
| 2022/0253112 A1 | 8/2022 | Hinton et al. |

FOREIGN PATENT DOCUMENTS

| | | |
|---|---|---|
| CN | 105027021 B | 4/2019 |
| EP | 3188230 A1 | 7/2017 |
| KR | 20110028428 A | 3/2011 |
| KR | 20190077920 A | 7/2019 |
| WO | 2019018597 A1 | 1/2019 |

\* cited by examiner

LIQUID-IN-LIQUID COOLING SYSTEM FOR ELECTRONIC COMPONENTS

BACKGROUND

Electronics in cloud data center, blockchain, artificial intelligence, edge, and other computing applications are continually becoming more widespread. End-users of these electronics seek high density computing and reliable operation to enable innovation in machine learning, financial services, life sciences, bitcoin mining, oil and gas prospecting, scientific computing, and other applications.

Heat is frequently generated during operation of electronic components. Typically, systems comprising electronic components need to be configured to transfer heat away from these components. For instance, a computer processor may contain a large number of transistors that convert electrical energy into thermal energy during operation, thereby increasing the temperature of the processor. If there is no suitably efficient path for that heat to be transferred away from the processor during operation, the processor may exceed the temperature at which it can be safely operated over the desired operational lifetime.

There are a variety of different categories of cooling systems available for cooling electronic components. One category is air cooling in which fans direct air so that it flows over the components. Heat is transferred from the electronic components to the air and carried away in the air flow. Another category is liquid cooling, in which a liquid acts as a heat exchanger to carry heat away from a component. Liquid cooling has major advantages over air cooling in that its fluid properties allow for more efficient transfer of heat. In some cases, liquid cooling may involve a conductive block (e.g., metal block) through which a liquid is passed. In this case, heat may be transferred to the liquid through the conductive block. In other cases, a liquid may be brought into direct contact with a surface of the component, whether by submerging the component in the liquid, or by directing jets of liquid onto the component.

Some cooling systems for electronic components supply a liquid directly to the electronic component. One example of this type of approach, often referred to as immersion cooling, involves submerging the electronic components in a liquid that is thermally conductive, but has a sufficiently low electrical conductivity so as not to interfere with electrical operation of the components. Heat generated by the components may be transferred to the liquid in which they are immersed, and this heat can be removed from the system by circulating the liquid through a heat exchanger. Suitable liquids used for immersion cooling may include dielectric liquids, such as oils.

While immersion cooling may be effective for some applications, suitable coolant liquids for this approach generally have a lower thermal conductivity than liquids used for other liquid cooling solutions. As a result, immersion cooling tends to be less effective for high power electronic components that generate a lot of heat because the liquid may be unable to transfer a sufficient amount of heat from the high power components to the liquids to effectively cool the components. The dielectric coolants still have improved fluid properties over those of air, however, allowing for improved cooling of lower powered or low power density components compared to other liquid cooling systems (e.g., cold plate solutions as described below). Liquids used as the coolant in immersion cooling also tend to be more expensive than other liquid cooling solutions (e.g., contrast the cost of mineral oil to that of water).

Another type of liquid cooling is cold plate liquid cooling, which involves passing a liquid through a cooling block mounted to an electronic component in a surrounding air environment. In this case, heat may be transferred from the electronic component into the liquid coolant via the mounted cooling block. Because cold plate liquid cooling systems are nominally sealed from the surrounding electronics, thermally conductive coolants can be used to remove heat, which results in improved heat transfer capability. However, lower powered or low power density auxiliary electronic components near the cold plate liquid cooling block may also require cooling, which is most easily implemented via fans circulating the ambient air. Fans are typically of low cooling efficacy and can be energy inefficient or infrastructure intensive. With cold plate liquid cooling, there is a risk that condensation may form on the exterior of the system, or a leak forming. Both of these situations may cause a significant amount of damage to the electronic components in the system.

Another type of liquid cooling system utilizes a cooling module that is enclosed over a component. These systems, sometimes referred to as direct-to-chip cooling systems, typically utilize a conductive coolant such as water, and are highly effective at cooling. Direct-to-chip cooling systems are arranged so that coolant liquid only contacts non-conductive parts of the component (e.g., the die on the back of a processor), which requires the coolant liquid to be carefully arranged within a closed system that interfaces with the component. As with cold plate liquid cooling, direct-to-chip cooling systems engender a higher risk of condensation forming on the exterior of the system, or springing a leak, which may lead to a significant amount of damage to the components in the electronic system.

SUMMARY

Embodiments of the present invention provide a cooling system and method of cooling electronic components that mitigate the above-described risks and challenges associated with other liquid cooling systems. In particular, the systems and methods described herein provide a tank (or other vessel) in which a dielectric liquid cools low power electronic components within the tank, while a conductive liquid cools high power electronic components in the tank. The conductive liquid is supplied via a plurality of cooling modules, each arranged on or in proximity to a high power component.

According to some embodiments, a cooling module arranged within a tank may enclose an electronic component (e.g., using a fluid-tight seal). Such a cooling module may include one or more fluid inlets and one or more fluid outlets to pass a conductive liquid directly onto the surface of the electronic component and then away from the component and out of the cooling module. It may be noted that such a cooling module differs from prior cooling solutions that use a cold plate that contacts a component via a thermal interface material that is generated by the component such as a thermal paste. In cold plates, only the heat successfully conducted from the electronic component to the cold plate via the thermal interface material is removed by the liquid. In contrast, the cooling module described above directs the liquid directly onto the component itself, and as a result, may cool the component much more efficiently. Alternatively, the cooling module may be configured as a closed cold plate module, in which fluid passes through a closed structure instead of the device surface directly, and which contacts the electronic component via a thermal interface material such as a thermal paste.

According to some embodiments, a cooling module arranged within a tank may be arranged in proximity to, but separated from, an electronic component and may comprise one or more nozzles for jetting a conductive cooling liquid onto the electronic component. Suitable structures, such as walls or other barriers, may be formed within the tank (e.g., attached to a PCB or otherwise) to direct conductive liquid droplets to a desired part of the tank for removal.

According to some embodiments, one or more electronic components in the tank may be treated to adjust the wettability of their surface(s). For instance, the surfaces of one or more electronic components may be treated to make the surfaces more hydrophobic or hydrophilic (more water repelling or more water attracting, respectively), and/or one or more electronic components may be treated to make the surfaces more oleophobic or oleophilic (more oil repelling or more oil attracting, respectively). Whereas the surface of one or more low power electronic components may be treated to be more hydrophobic and/or oleophilic. Such a configuration may increase the extent to which a dielectric liquid coolant (which may be, or may comprise, an oil) is attracted to the surface of the low power electronic components and decrease the extent to which the dielectric liquid coolant is attracted to the surface of the high power electronic components. Similarly, such a configuration may increase the extent to which a conductive liquid coolant (which may be, or may comprise, water) is attracted to the surface of the high power electronic components and decrease the extent to which the conductive liquid coolant is attracted to the surface of the low power electronic components.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Following below are more detailed descriptions of various concepts related to, and embodiments of, techniques for liquid-in-liquid cooling of electronic components. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

Figure 1:
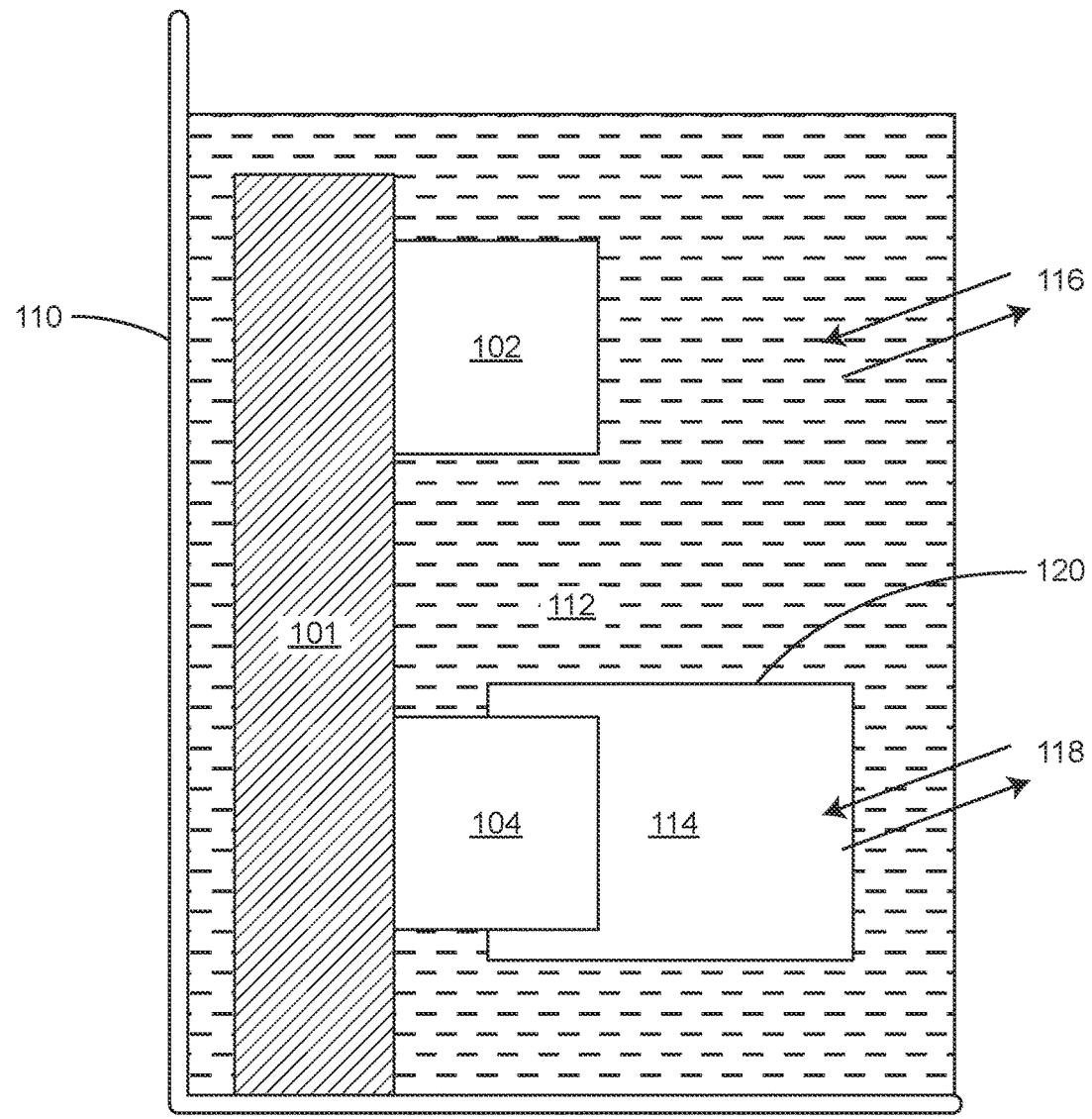
FIG. 1 is a high-level schematic diagram of a liquid-in-liquid cooling system, according to some embodiments.

As an overview of the techniques outlined above, FIG. 1 depicts a high-level schematic diagram of a liquid-in-liquid cooling system according to some embodiments. In the example of FIG. 1, electronic components 102 and 104 are mounted onto a board 101 (e.g., a motherboard, a system board, main circuit board, main board, etc.). For purposes of description, components 102 and 104 are referred to herein as "low power" and "high power" components, respectively, although these terms should not be viewed as limiting, as discussed further below.

In the example of FIG. 1, the board 101 and components 102 and 104 are arranged within a vessel 110 (a portion of which is shown in the drawing), which may be any suitable vessel for holding a liquid. A first liquid 112 is held in the vessel 110, and is circulated into and out of the vessel as illustrated by the arrows 116 in FIG. 1. In addition, as shown by arrows 118 in FIG. 1, a second liquid 114 is delivered to the high power component 104 via a cooling module 120 that encloses the high power component 104. The second liquid 114 is removed from the cooling module 120 after heat from the component 104 is transferred to the second liquid 114. Various techniques for implementing the delivery of the second liquid 114 may be used, and examples are described below.

According to some embodiments, the first liquid 112 may be a dielectric liquid. In some implementations, the first liquid may be, or may comprise, a synthetic oil (e.g. PAO [polyalphaolefin]), a mineral oil (e.g. paraffin oil), a silicone oil, a fluorinated fluid (e.g., FluorInert™ from 3M), or combinations thereof.

According to some embodiments, the first liquid 112 may have an electrical conductivity of greater than or equal to $1\times10^{-12}$ S/m, $5\times10^{-12}$ S/m, $1\times10^{-11}$ S/m, $5\times10^{-11}$ S/m, or $1\times10^{-10}$ S/m. According to some embodiments, the first liquid may have an electrical conductivity of less than or equal to $1\times10^{-9}$ S/m, $1\times10^{-10}$ S/m, $5\times10^{-11}$ S/m, $1\times10^{-11}$ S/m, $5\times10^{-12}$ S/m, or $1\times10^{-12}$ S/m. Any suitable combinations of the above-referenced ranges are also possible (e.g., the electrical conductivity of the first liquid is greater or equal to $1\times10^{-12}$ S/m and less than or equal to $1\times10^{-10}$ S/m, etc.).

According to some embodiments, the first liquid 112 may have a thermal conductivity of greater than or equal to 0.05 W/m·K, 0.10 W/m·K, 0.15 W/m·K, or 0.20 W/m·K. According to some embodiments, the first liquid may have a thermal conductivity of less than or equal to 0.25 W/m·K, 0.20 W/m·K, 0.15 W/m·K, or 0.10 W/m·K. Any suitable combinations of the above-referenced ranges are also possible (e.g., a thermal conductivity of the first liquid is greater or equal to 0.10 W/m·K and less than or equal to 0.20 W/m·K, etc.

According to some embodiments, the first liquid 112 may have a density of greater than or equal to 600 kg/m$^3$, 700 kg/m$^3$, 800 kg/m$^3$, or 900 kg/m$^3$. According to some embodiments, the first liquid may have a density of less than or equal to 1000 kg/m$^3$, 900 kg/m$^3$, 800 kg/m$^3$, or 700 kg/m$^3$. Any suitable combinations of the above-referenced ranges are also possible (e.g., a density of the first liquid is greater or equal to 700 kg/m$^3$ and less than or equal to 900 kg/m$^3$, etc.).

According to some embodiments, the first liquid 112 may have a specific heat of greater than or equal to 1500 J/kg·K, 2000 J/kg·K, 2250 J/kg·K, 2500 J/kg·K, or 2750 J/kg·K. According to some embodiments, the first liquid may have a specific heat of less than or equal to 3000 J/kg·K, 2750 J/kg·K, 2500 J/kg·K, 2250 J/kg·K, or 2000 J/kg·K. Any suitable combinations of the above-referenced ranges are also possible (e.g., a specific heat of the first liquid is greater or equal to 2000 J/kg·K and less than or equal to 2500 J/kg·K, etc.).

According to some embodiments, the first liquid 112 may have a dielectric strength of greater than or equal to $1\times10^6$ V/m, $5\times10^6$ V/m, $10\times10^6$ V/m, $15\times10^6$ V/m or $20\times10^6$ V/m. According to some embodiments, the first liquid may have a dielectric strength of less than or equal to $35\times10^6$ V/m, $30\times10^6$ V/m, $25\times10^6$ V/m, $20\times10^6$ V/m or $15\times10^6$ V/m. Any suitable combinations of the above-referenced ranges are also possible (e.g., a dielectric strength of the first liquid is greater or equal to $10\times10^6$ V/m and less than or equal to $30\times10^6$ V/m, etc.).

According to some embodiments, the second liquid 114 may be a conductive liquid. In some implementations, the second liquid may be, or may comprise, water, a water-glycol mix (e.g., ethylene glycol, propylene glycol), a liquid metal (e.g., mercury), ammonia, or combinations thereof.

According to some embodiments, the second liquid 114 may have an electrical conductivity of greater than or equal to $1\times10^{-6}$ S/m, $1\times10^{-5}$ S/m, $1\times10^{-4}$ S/m, $5\times10^{-4}$ S/m, $1\times10^{-3}$ S/m, $5\times10^{-3}$ S/m, or $1\times10^{-2}$ S/m. According to some embodiments, the second liquid may have an electrical conductivity of less than or equal to $1\times10^{-1}$ S/m, $1\times10^{-2}$ S/m, $5\times10^{-3}$ S/m, $1\times10^{-3}$ S/m, $5\times10^{-4}$ S/m, or $1\times10^{-4}$ S/m,. Any suitable combinations of the above-referenced ranges are also possible (e.g., the electrical conductivity of the second liquid is greater or equal to $1\times10^{-4}$ S/m and less than or equal to $1\times10^{-2}$ S/m, etc.).

According to some embodiments, the second liquid 114 may have a thermal conductivity of greater than or equal to 0.30 W/m·K, 0.40 W/m·K, 0.50 W/m·K, 0.60 W/m·K, or 0.70 W/m·K. According to some embodiments, the second liquid may have a thermal conductivity of less than or equal to 0.80 W/m·K, 0.70 W/m·K, 0.60 W/m·K, 0.50 W/m·K, or 0.40 W/m·K. Any suitable combinations of the above-referenced ranges are also possible (e.g., a thermal conductivity of the second liquid is greater or equal to 0.30 W/m·K and less than or equal to 0.70 W/m·K, etc.).

According to some embodiments, the second liquid 114 may have a density of greater than or equal to 800 kg/m$^3$, 900 kg/m$^3$, 1000 kg/m$^3$, or 1100 kg/m$^3$. According to some embodiments, the second liquid may have a density of less than or equal to 1200 kg/m$^3$, 1100 kg/m$^3$, 1000 kg/m$^3$, or 900 kg/m$^3$. Any suitable combinations of the above-referenced ranges are also possible (e.g., a density of the second liquid is greater or equal to 900 kg/m$^3$ and less than or equal to 1100 kg/m$^3$, etc.).

According to some embodiments, the second liquid 114 may have a specific heat of greater than or equal to 2500 J/kg·K, 3000 J/kg·K, 3500 J/kg·K, 4000 J/kg·K, or 4500 J/kg·K. According to some embodiments, the second liquid may have a specific heat of less than or equal to 5000 J/kg·K, 4500 J/kg·K, 4000 J/kg·K, 3500 J/kg·K, or 3000 J/kg·K. Any suitable combinations of the above-referenced ranges are also possible (e.g., a specific heat of the second liquid is greater or equal to 3000 J/kg·K and less than or equal to 4500 J/kg·K, etc.).

According to some embodiments, the first liquid 112 and/or the second liquid 114 may comprise one or more additives. Suitable additives may include one or more biocides, corrosion inhibitors, surfactants, or combinations thereof.

Biocides may include additives to inhibit growth or proliferation of unwanted organisms within a coolant. Some biocides for cooling systems may target limiting growth of algae, which can occur in, for example, water-based coolants when subject to ultraviolet light sources. Suitable examples of biocides that the first liquid and/or second liquid may include, but are not limited to, alcohols, aldehydes, chlorines, chlorine releasing agents (e.g. sodium hypochlorite, peroxygen compounds, etc.), or combinations thereof.

Corrosion inhibitors may include additives to prevent or minimize the deterioration of materials, especially that of galvanic corrosion in electrical circuits and fluid systems that have dissimilar metals of varying electrochemical potentials. Suitable examples of corrosion inhibitors that the first liquid and/or second liquid may comprise include, but are not limited to, azole compounds, triazole compounds, sodium nitrite, sodium molybdate, or combinations thereof.

Surfactants may comprise, or may be composed of, molecules that have a hydrophilic and a hydrophobic part, resulting in a tendency to accumulate at and maintain interfaces between coolants of different hydrophilicity and between coolants and surfaces. That is, when added to liquids, surfactants may enhance the immiscibility of two fluids, or may alter the wettability of certain fluids to certain surfaces. There are surfactants that, based on their molecular structure, are better suited for forming water droplets in oil, such as mono-valent soaps. Others, such as bi- or tri-valent soaps, are better suited for forming oil droplets in water. Suitable examples of surfactants that the first liquid and/or second liquid may comprise include, but are not limited to, mono-valent soaps, bi-valent soaps, tri-valent soaps, alkyl sulfates, quarternary ammonium salts, ethoxylated alphatic alcohol, amophoacetates, or combinations thereof.

According to some embodiments, the low power electronic components 102 may be treated with a surface coating to increase their wettability with respect to the first liquid and/or may be treated with a surface coating to decrease their wettability with respect to the second liquid. A surface coating may, for instance, be a conformal coat and may include coatings such as, but not limited to, fluorinated compounds, chlorinated compounds, silicones, polysiloxanes, urethanes, polyurethanes, acrylics, epoxies, or combinations thereof.

According to some embodiments, the high power electronic components 104 may be treated with a surface coating and/or nanofabricated structures to increase their wettability with respect to the second liquid and/or may be treated with a surface coating to decrease their wettability with respect to the first liquid. Examples of suitable coatings may include silicon dioxides, zinc oxides, or combinations thereof.

As noted above, while electronic components 102 and 104 are referred to herein as "low power" and "high power" components, these labels are intended to distinguish between different types of electronic components that may be more or less suitable for the two types of liquid cooling embodied by the techniques described herein. As discussed above, since immersion cooling is generally more suitable for comparatively lower power electronic components, such components may be more suited to be cooled by the first liquid in the example of FIG. 1. Similarly, since direct-to-chip cooling may be more suitable for comparatively higher power electronic components, such components may be more suited to be cooled by the second liquid in the example of FIG. 1. It will be appreciated that either type of cooling may be used to cool an electronic component irrespective of its power consumption, however. As such, whenever "low power" or "high power" are used to refer to an electronic component herein, it will be understood that these terms are not limiting with respect to the electronic component, but are merely used for illustrative and descriptive purposes.

As used herein, an "electronic component" may refer to any suitable processor or collection of processors. Such processors may be implemented as integrated circuits, or as one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, FPGA or semi-custom circuitry resulting from configuring a programmable logic device. As yet a further alternative, a processor may be a portion of a larger circuit or semiconductor device, whether commercially available, semi-custom or custom. The electronic components also need not be limited to processors or computing electronics, as alternative devices such as transformers, power conversion electronics, radio frequency amplifiers or electronics, or other such heat generating electronic components may also be cooled via the techniques described herein.

Figure 2A:
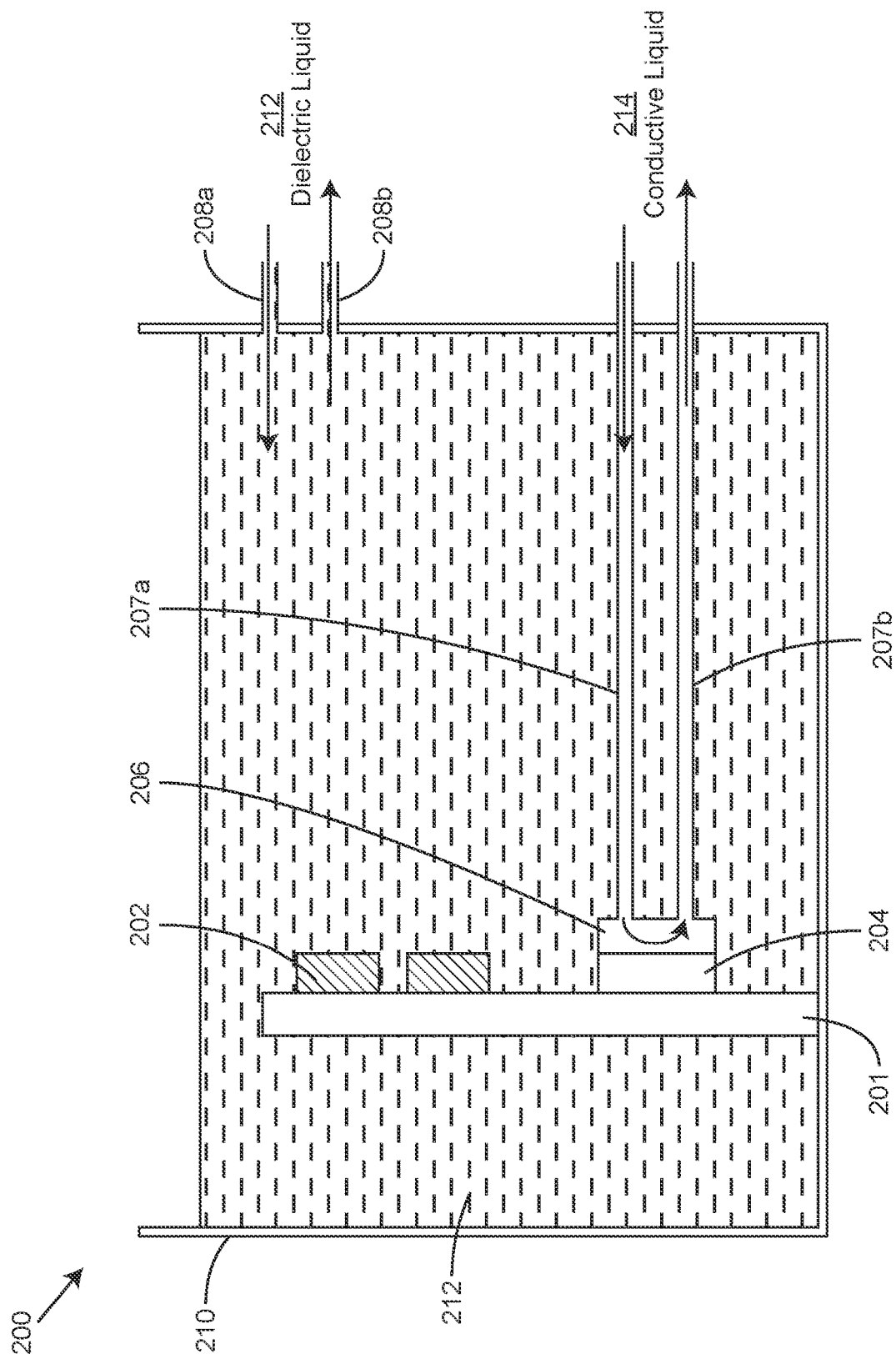
FIG. 2A depicts an illustrative implementation of a liquid-in-liquid cooling system in which a cooling module is enclosed around an electronic component, according to some embodiments.
Figure 2B:
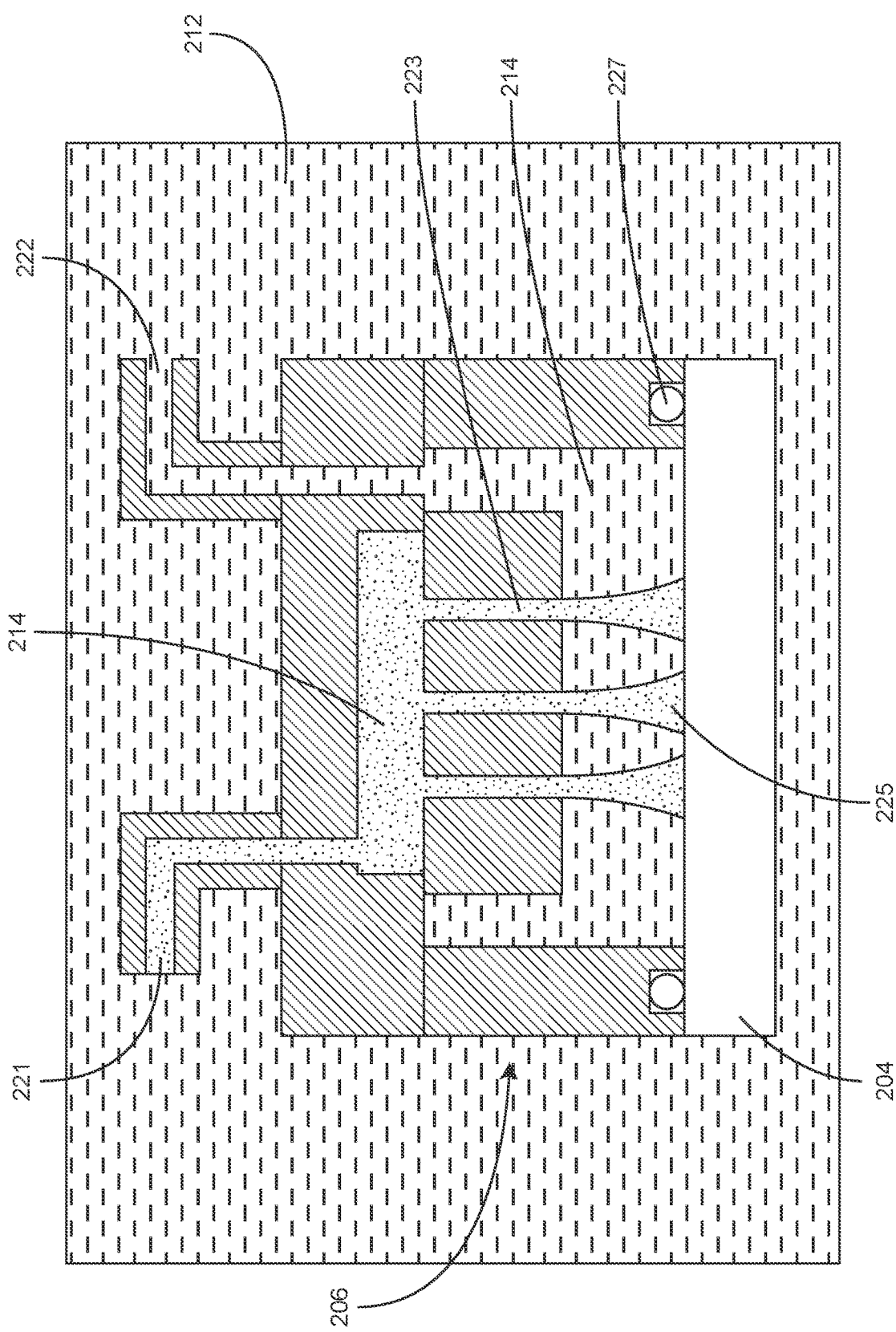
FIG. 2B is a cross-sectional view of an illustrative cold plate cooling module, implementing jet cooling and forming a fluid tight seal, according to some embodiments.

To further illustrate the implementation of the schematic view shown in FIG. 1, a more detailed illustration of a liquid-in-liquid cooling system is depicted in FIG. 2A. As shown in the example of FIG. 2A, system 200 comprises electronic components 202 and 204 mounted onto a board 201 within a vessel 210 that holds a dielectric liquid 212. A cooling module 206 is mounted over the high power electronic component 204 and includes fluid channels 207a and 207b through which a conductive liquid 214 flows. Cooling is delivered to high power electronic component 204 via cooling module 206. The cooling module 206 is configured to surround and enclose the high power electronic component 204. The conductive liquid 214 may contact the surface of the electronic component 204 and carry heat away from the component. A fluid inlet 208a and fluid outlet 208b convey the dielectric fluid into and out of the vessel 210, respectively. Various techniques for implementing the delivery of the first liquid 212 and second liquid 214 may be applied, with examples described below One illustrative example of a cooling module suitable for use as cooling module 206 in FIG. 2A is shown in FIG. 2B. As shown in FIG. 2B, a cooling module 206 is deployed onto the face of an electronic component 204 (e.g., a lidded surface or a non-electrically conductive silicon die face of a processor). The cooling module includes narrow channels 223 that turns the conductive liquid 214 into jets as it flows into the module through at least one inlet conduit, port, or fitting 221. The jets 225 impinge directly onto the electronic component 204. In this embodiment, the conductive liquid 214 is shown both with lighter shading and darker shading in FIG. 2B to visually distinguish the incoming conductive liquid from the conductive liquid within the module after it is jetted.

After jetting, the conductive liquid exits the module through at least one outlet conduit, port, or fitting 222. A fluid tight seal 227 may be disposed between the device surface 204 and the cooling module 206, so as to nominally contain the conductive liquid coolant within the cooling module 206 and passageways 207a and 207b. The fluid tight seal 227 may take on any variety of forms, including o-rings, gaskets, adhesives, solders, and/or any suitable sealing technique. Surrounding the cooling module is the dielectric fluid, 212.

Such a configuration shown in FIG. 2B may be considered microjet cooling, which generates high heat transfer coefficient convective flow incident on high power and high power density device surfaces. Other types of cooling modules 206 may also be utilized in the system of FIG. 2A, including but not limited to microchannels, mini-channels, pin fins, skived fins, or other cold plate or direct-to-chip cooling technologies.

In some embodiments, the cooling module 206 may be attached to the board 201 via one or more suitable fasteners such as clamps, screws, and/or other structures that may be operated to engage and disengage mechanical attachment of the module with the board.

In some embodiments, any one or more of fluid inlets 207a and 208a and fluid outlets 208a and 208b may comprise one or more filters (not shown in the figures) to remove matter that may, if circulating in the vessel 210, damage or foul small features in the cooling module 206 and/or on the board 201. In some cases, the filter(s) may separate out matter than could damage a pump coupled to one or more of the fluid inlets or outlets.

In some embodiments, vessel 210 may comprise, or may be coupled to, one or more monitoring systems configured to monitor an amount of one or more additives in the dielectric liquid 212 and/or conductive liquid 214 (e.g., an amount of a surfactant, a biocide, etc.), monitor a resistivity of the dielectric liquid 212 and/or conductive liquid 214, control for a level of contamination in the dielectric liquid 212 and/or conductive liquid 214, or combinations thereof. In some embodiments, the system 200 may comprise common fluid manifolds configured to deliver the conductive liquid 214 to a plurality of cooling modules 206, whether on the same board 201 and/or on a plurality of different boards.

Figure 2C:
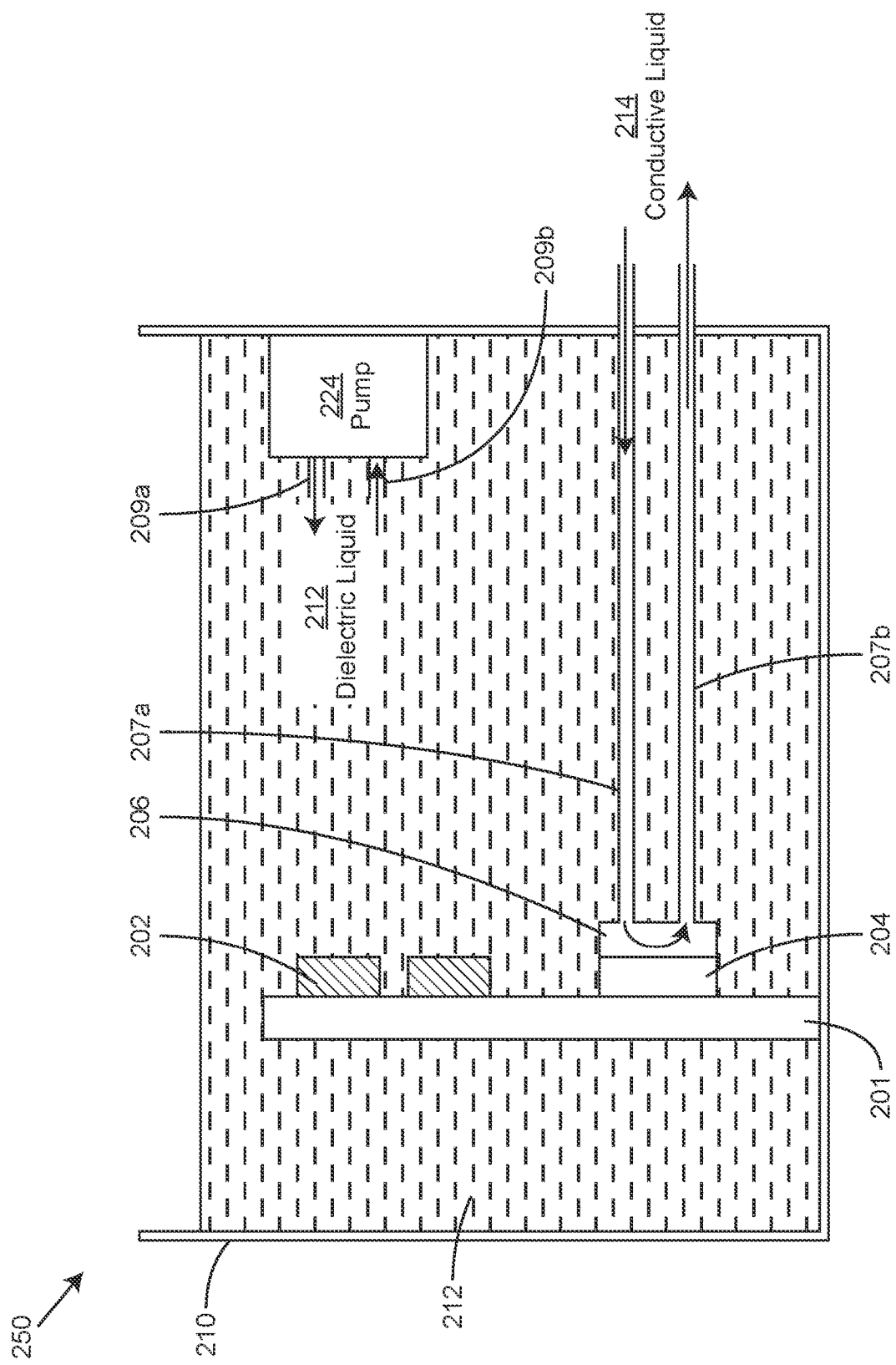
FIG. 2C depicts an alternative implementation of the system of FIG. 2A in which the dielectric liquid is circulated within the vessel via a pump, according to some embodiments.

An alternative implementation of FIG. 2A is shown in FIG. 2C, according to some embodiments. System 250 shown in FIG. 2C is the same as system 200 shown in FIG. 2A, except instead of the dielectric liquid 212 being delivered into the vessel 210 via an inlet and removed from the vessel via an outlet, the dielectric liquid is circulated within the vessel using a pump 224, which has its own fluid inlet and fluid outlet 209a and 209b, respectively. In the example of FIG. 2C, the dielectric liquid 212 may not be circulated into and out of the vessel, but may instead be circulated only within the vessel. In some embodiments, system 250 may comprise a heat exchanger (not shown in FIGS. 2A-2C) arranged adjacent to the vessel 210 and configured to transfer away heat from the dielectric liquid 212. A heat exchanger may additionally or alternatively be arranged to transfer away heat from the conductive liquid 214 in this manner.

As discussed above, one advantage of the techniques described herein may be to mitigate problems caused by leaks of conductive liquid, which can occur with a conventional cooling module arranged on an electronic component. To illustrate this effect further, FIGS. 3A-3C demonstrate the utility of a dielectric liquid 312 in mitigating the leak risk which traditionally hampers cold plate liquid cooling techniques utilizing conductive coolants. In the field of surface physics, the attraction of a given coolant to a surface is often times characterized by a "contact angle". A smaller contact angle with the surface (measured through the fluid) signifies a great level of attraction between the liquid and the surface. A larger contact angle signifies a lower level of attraction between the liquid and the surface.

Figure 3A:
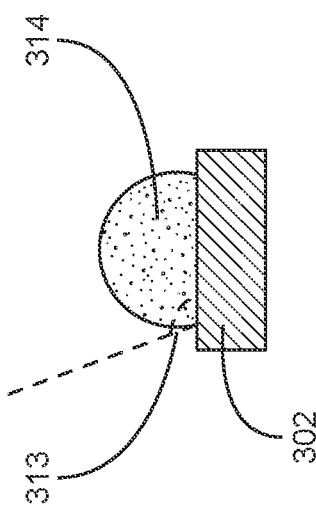
FIG. 3A depicts a surface-fluid interaction exhibiting high wettability, according to some embodiments.
Figure 3B:
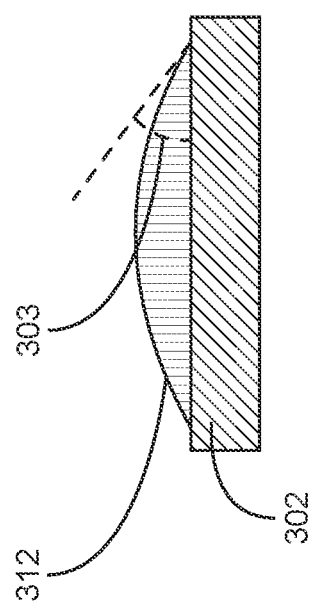
FIG. 3B depicts a surface-fluid interaction exhibiting low wettability, according to some embodiments.
Figure 3C:
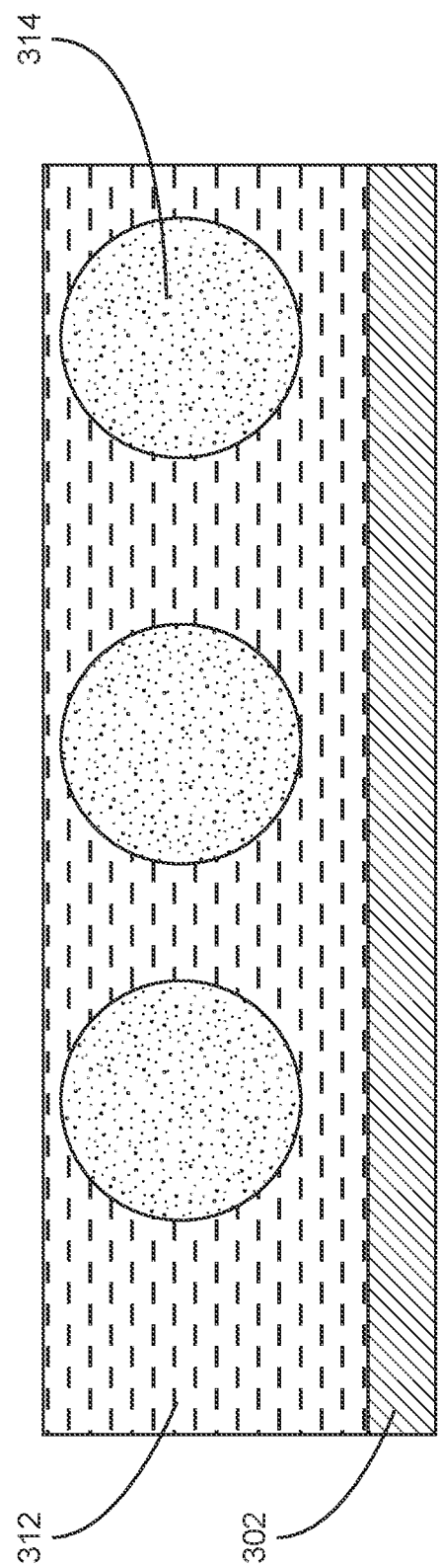
FIG. 3C depicts a high wettability surface-fluid interaction forming a protective fluid barrier against a surface-fluid interaction of a lower wettability, according to some embodiments.

FIG. 3A provides an example of a high fluid-surface wettability interaction via a comparatively small contact angle. First liquid 312 on surface 302 exhibits an acute contact angle 303, demonstrating a high affinity (or high wettability) between the liquid 312 and the surface 302. FIG. 3B, on the other hand, shows a second liquid 314 on surface 302 exhibiting an obtuse contact angle 313, demonstrating a comparatively low affinity (or comparatively low wettability) between the liquid and the surface. Note that the contact angles need not be acute or obtuse to establish relative wettability, but in general smaller contact angles imply greater surface affinity. When liquids 312 and 314 are combined, the high wettability liquid 312 has a greater surface attraction to surface 302 than the low wettability liquid 314, and therefore the high wettability liquid 312 tends to form a blanket in between the surface 302 and the low wettability liquid 314.

In some embodiments, the dielectric liquid 212 may be chosen to have a comparatively higher surface affinity with respect to low power electronic components 302 and board 301. The conductive liquid 314 may be chosen to have a comparatively lower surface affinity to low power electronic components 302 and board 301 than that of the dielectric liquid 212.

Therefore, in the event of a leak of the conductive liquid 214 from the cooling module 206, the conductive liquid can remain in a separate phase as a droplet within the surrounding dielectric liquid 312, and can remain repelled from the surface of electronic components 302 and board 301. These effects may restrict interaction between the conductive coolant and the active electrical circuitry, avoiding the potential for damage that may occur in systems with conductive coolants and circuit boards and electronic components in air environments. Said another way, the risk of the conductive liquid doing harm may decrease substantially as the electrical component is encapsulated in a protective layer of dielectric liquid.

Another implementation of the schematic view shown in FIG. 1 is depicted in FIG. 4A, according to some embodiments. In the example of FIG. 4A, cooling is delivered to a high power electronic component via a plurality of nozzles in a cooling module that is proximate to, but not in contact with, the electronic component. System 400 shown in FIG. 4A comprises electronic components 402 and 404 mounted onto a board 401 within a vessel 410 that holds a dielectric liquid 412. A fluid inlet 408a and fluid outlet 408b convey the dielectric fluid into and out of the vessel 410, respectively.

In the example of FIG. 4A, a cooling module 409 is mounted onto the high power electronic component 404 and includes a fluid inlet 407a and fluid outlet 407b through which a conductive liquid 414 flows. The cooling module 409 comprises one or more nozzles that form jets of the conductive liquid when the conductive liquid passes through the module. As shown in FIG. 4A, the conductive liquid may be incident on the surface of the electronic component 404 and carry heat away from the component while the conductive liquid is otherwise surrounded by the dielectric liquid 412. Note that the surface of component 404 is typically an inactive surface of the circuit, such as a lid or non-active die surface Since the two liquids are immiscible, however, the conductive liquid does not generally mix with the dielectric liquid and remains as a separate liquid phase. Furthermore, with the dielectric liquid 412 demonstrating higher surface affinity to board 401 and low power components 402, the conductive liquid 414 remains repelled by the dielectric liquid 412 and does not cause damage or short circuits.

In the example of FIG. 4A, the conductive liquid 414 is more dense than the dielectric liquid 412. As a result, the conductive liquid will eventually sink to the bottom of the vessel 410 to produce a stratified layer of the conductive liquid 415 at the bottom of the vessel. The fluid outlet 407b is arranged at, or close to, the bottom of the vessel in this example to remove the conductive liquid that has settled at the bottom of the vessel.

In other cases, the conductive liquid 414 may be less dense than the dielectric liquid 412. In such a case, the conductive liquid will eventually rise to the top of the vessel 410 to produce a layer of the conductive liquid 415 at the top of the vessel. In this case, the fluid outlet 407b may instead be arranged close to the top of the vessel. In some embodiments, separating and recovering the conductive liquid 414 may be performed via one or more devices that do not rely on relative density of the two liquids, however.

In some embodiments, the cooling module 409 may share a similar structure to the cooling module 206 shown in FIG. 2B. An illustrative example of cooling module 409 is shown in FIG. 4B. As shown in FIG. 4B, a cooling module 409 is deployed in proximity to the face of an electronic component 404 (e.g., a lidded surface or a non-conductive silicon die face of a processor). The cooling module 409 includes narrow channels or nozzles 423 that turns the conductive liquid to jets as it flows into the module through at least one inlet conduit, port, or fitting 421. The jets 425 of the conductive liquid 414, impinge directly onto the electronic component 404. In this embodiment, unlike that of FIG. 2B, the surrounding liquid 412 is not the same as that which forms the jets 425, as the surrounding liquid 412 is the dielectric liquid immersing the electronics. The conductive liquid then undergoes droplet coalescence, due to its immiscibility, to form droplets 438, which is then disposed of elsewhere in the system as described above.

Note that in this configuration, the conductive fluid jets 425 may make direct contact with the heated surface 404 by displacing the dielectric fluid away from the surface 404 due to their elevated momentum by passing through the narrow channels 423. However, there may be scenarios where a layer, even if microscopic, of dielectric liquid remains between the device surface 404 and cooling jets 425. This may introduce a minor resistance for heat flow from the heated surface 404 into the conductive coolant, but no substantial change in operation may be expected as a result.

In some embodiments, the high power electronic component 404 may be treated with a surface coating and/or nanofabricated structures to increase its wettability with respect to the conductive liquid 414 and/or may be treated with a surface coating to decrease their wettability with respect to the dielectric liquid. For instance, the component 404 may comprise one or more surface coatings that enhance wettability with water-based liquids such as, but not limited to, silicon dioxides, zinc oxides, or combinations thereof.

Returning to FIG. 4A, in some embodiments, system 400 may include an optional sensor 420 that is configured to monitor a fluid level of the conductive liquid 415 at the bottom of the vessel 410 (e.g., a height of the top of the conductive liquid 415 above the bottom of the vessel). In some implementations, the sensor 420 may include a capacitive sensor. In some implementations, the vessel may comprise a float that floats at the liquid interface (e.g., is less dense than the conductive liquid and more dense than the dielectric liquid) and whose vertical position may be detected by the sensor 420. In some implementations, the sensor may comprise an optical view port and/or optical sensor to measure index of refraction. In some embodiments, sensor 420 may be coupled to a suitable controller configured to operate a pump coupled to fluid outlet 407b based on sensor data produced by the sensor. For example, the controller may turn the pump on when the sensor data indicates the fluid level is above a first threshold and may turn the pump off when the sensor data indicates the fluid level is below a second threshold. In this manner, the fluid level of the conductive liquid at the bottom of the tank may be maintained between two desired thresholds.

In some embodiments, any one or more of fluid inlets 407a and 408a and fluid outlets 408a and 408b may comprise one or more filters to remove matter that may, if circulating in the vessel 410, damage and/or foul small features in the cooling module 409 or on the board 401. In some cases, the filter(s) may separate out matter than could damage a pump coupled to one or more of the fluid inlets or outlets.

An alternative implementation of FIG. 4A is shown in FIG. 4C, according to some embodiments. System 450 shown in FIG. 4C is the same as system 400 shown in FIG. 4A, except instead of the dielectric liquid 412 being delivered into the vessel 410 via an inlet and removed from the vessel via an outlet, the dielectric liquid is circulated within the vessel using a pump 424, which has its own fluid inlet and fluid outlet 409a and 409b, respectively. In the example of FIG. 4C, the dielectric liquid 412 may not be circulated into and out of the vessel, but may instead be circulated only within the vessel. In some embodiments, system 450 may comprise a heat exchanger arranged adjacent to the vessel 410 and configured to transfer away heat from the dielectric liquid 412. A heat exchanger may be located within or adjacent to the vessel 410, and/or a heat exchanger may be located in a separate location (e.g., on the roof or outside of a facility) to transfer heat away from the dielectric liquid 412. Examples of the latter approach are discussed below. A heat exchanger may additionally or alternatively be arranged to transfer away heat from the conductive liquid 214 in this manner.

In any of the embodiments discussed above, an electrically non-conductive conformal coat material may also be applied to one or more boards and/or one or more electronic components to enhance and/or provide a non-electrically conductive layer or dielectric layer between the board and/or components and a conductive liquid. Suitable examples of electrically non-conductive conformal coat materials may include, but are not limited to, polysiloxanes, acrylics, urethanes, polyurethanes, silicones, epoxies, or combinations thereof. A conformal coating may be applied in addition to, or alternatively to, any surface coating(s) discussed above. One reason such a conformal coating may be advantageous is to meet lifetime goals for the system. While, in some cases, the system may function without such a coating, the application of the coating may desirably further extend the operational lifetime of the system.

Figure 4:
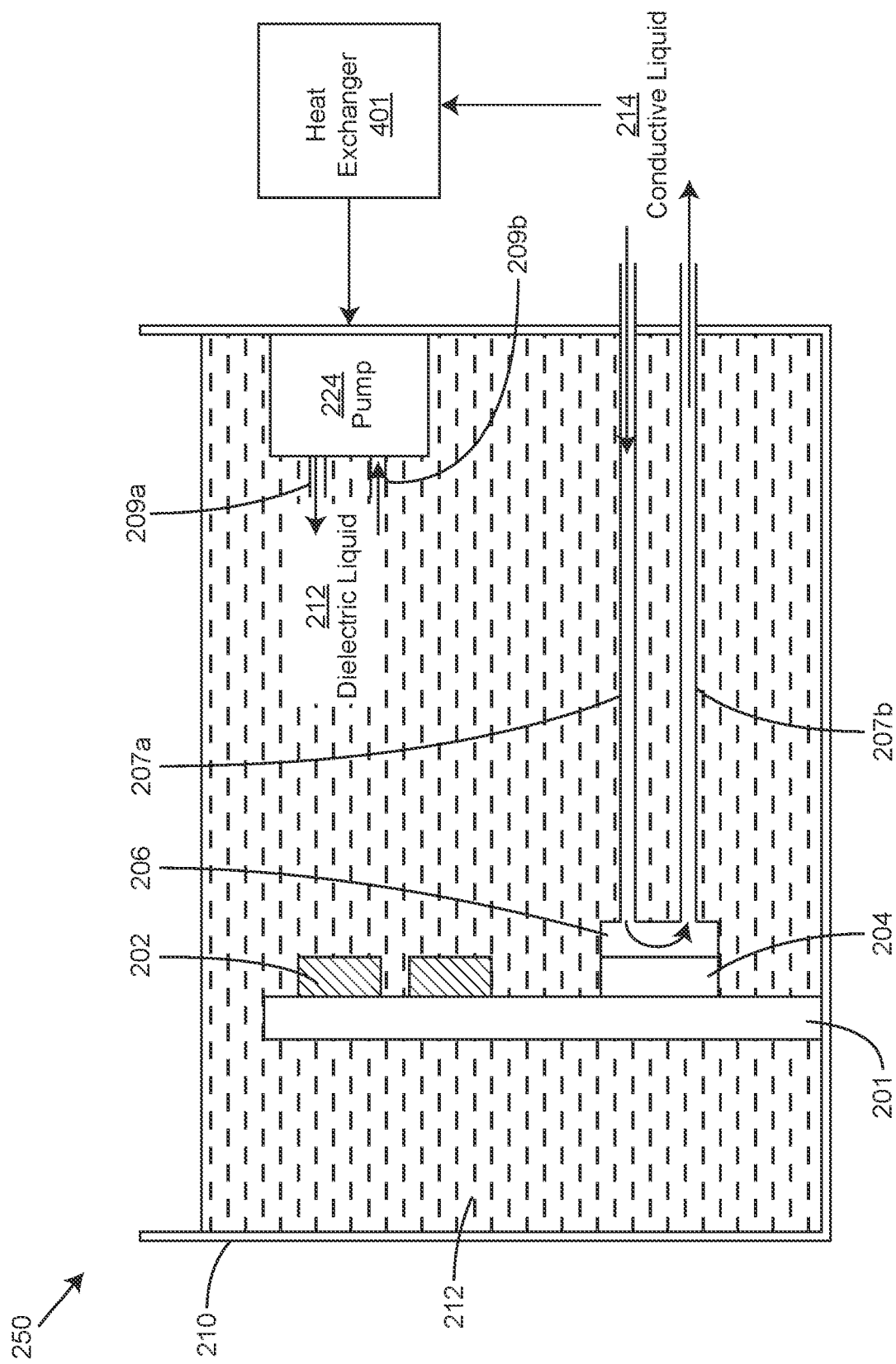
FIG. 4 depicts an alternative implementation of the system of FIG. 2C in which the dielectric liquid is circulated within the vessel via a pump and a heat exchanger, according to some embodiments.

The dielectric liquid and conductive liquid may be supplied to the illustrative systems shown in FIGS. 2A and 2C in any suitable way, including through the use of one or more pumps to circulate one or both liquids through the vessel and/or cooling module as appropriate. Suitable pumps may include positive displacement pumps (e.g., rotary pumps, reciprocating pumps, etc.), impulse pumps, piston pumps, valveless pumps, or combinations thereof. In some cases, one or more heat exchangers 401 may be arranged adjacent to the vessel (as shown in FIG. 4) to remove heat from the dielectric liquid and/or conductive liquid within the vessel. The systems described below in relation to FIGS. 5A-5D may each, in some embodiments, be combined with a vessel in which the electronics components are arranged (e.g., vessel 210 shown in FIG. 2A and FIG. 2C). As such, a single system may comprise the vessel and other elements shown and discussed above in either of FIG. 2A or 2C in addition to the elements from any one of FIGS. 5A-5D discussed below. In some implementations, this system may be arranged within a single housing.

FIGS. 5A-5D are schematics of various illustrative pumping and heat removal systems that may be coupled to a vessel, including but not limited to those examples shown in FIGS. 2A and 2B. These illustrative systems differ in the manner in which pumping and heat removal is performed, but are not intended to be limiting as other possible systems may also be envisioned. In each of the illustrative systems of FIGS. 5A-5D, dielectric liquid and conductive liquid are shown entering and exiting the system on the left side of the page. Each of these systems could, for instance, be coupled to the fluid inlets 207a and 208a, and fluid outlets 207b and 208b, shown in either of FIGS. 2A and 2B. Moreover, in FIGS. 5A-5D, heat exchangers are shown with a dashed line to represent an interaction; it will be appreciated that these figures are schematic drawings and in reality heat exchangers typically operate by flowing coolant through the heat exchanger volume facilitating intimate fluid contact for high effectiveness heat transfer between fluids. Any of the heat exchangers described herein may operate by transferring heat from a liquid to another liquid, and/or may operate by transferring heat from a liquid to a gas (e.g., air).

Figure 5A:
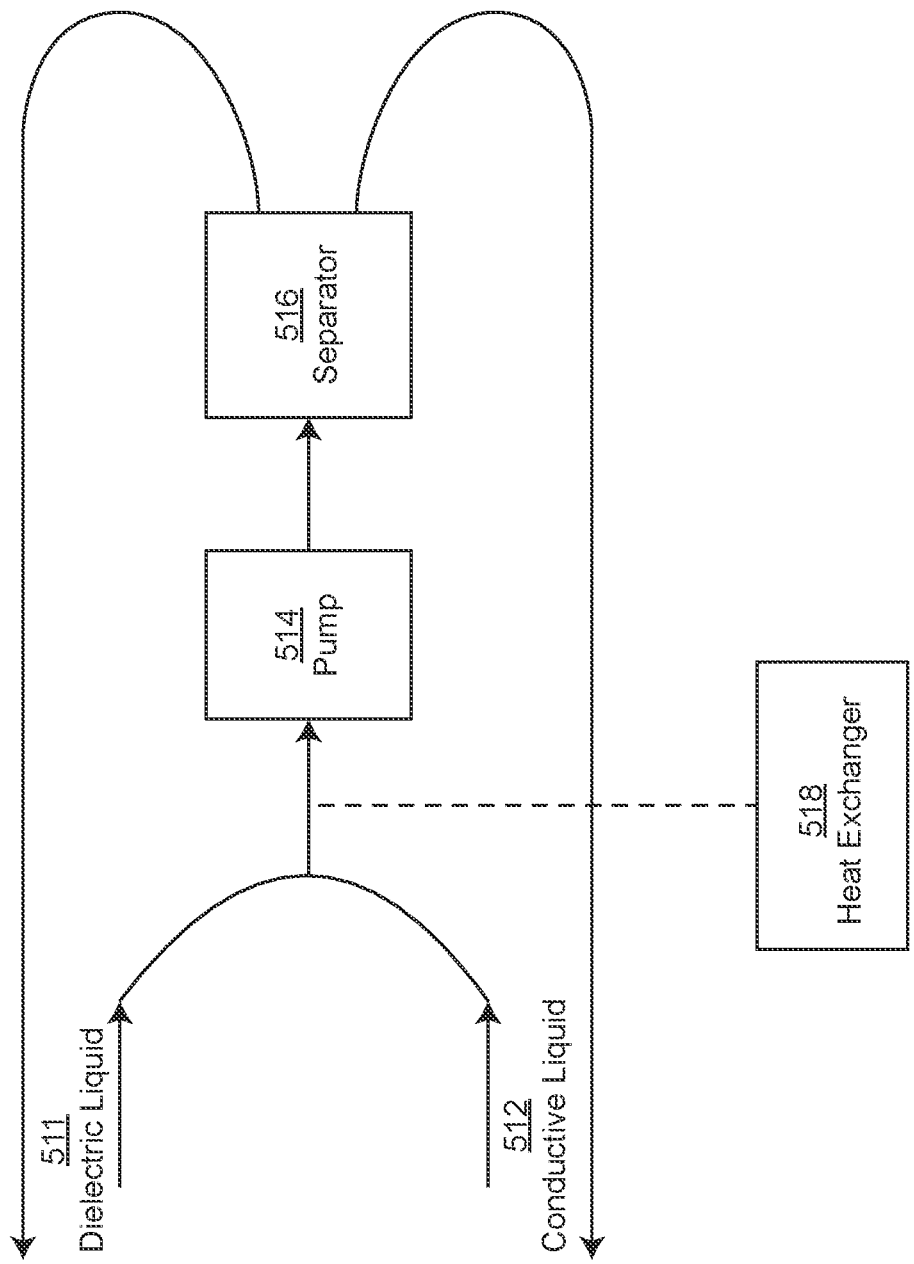
FIG. 5A is a schematic of a system suitable for circulating a dielectric liquid and a conductive liquid through a vessel, according to some embodiments.

FIG. 5A is a first illustrative schematic of a system suitable for circulating a dielectric liquid and a conductive liquid through a vessel, according to some embodiments. In the example of FIG. 5A, the dielectric liquid 511 and conductive liquid 512 are directed into a common channel, and heat is removed from both liquids in this channel via heat exchanger 518. The liquids at this stage may be mixed into an emulsion if there is sufficient agitation of the liquids in the channels, or may otherwise retain separate liquid phases. Subsequently, pump 514 provides an impulse for the liquids to be directed back to the vessel after passing through separator 516 which separates out the two types of liquid so that the dielectric liquid and conductive liquid each returns to their respective inlets of the vessel to be recirculated.

Fluid separator 516 may be configured to take advantage of differing fluid properties or molecular structures of the two liquids. Examples may include, but are not limited to, centrifuges for liquids of different densities, filtration for fluids of different molecule sizes (e.g., using one or more membranes), electric field separation via differences in polarity or electrical conductivity, or other such techniques. In some embodiments, a separator may or may not be needed for a given system depending on the level of immiscibility of the two fluids.

Figure 5B:
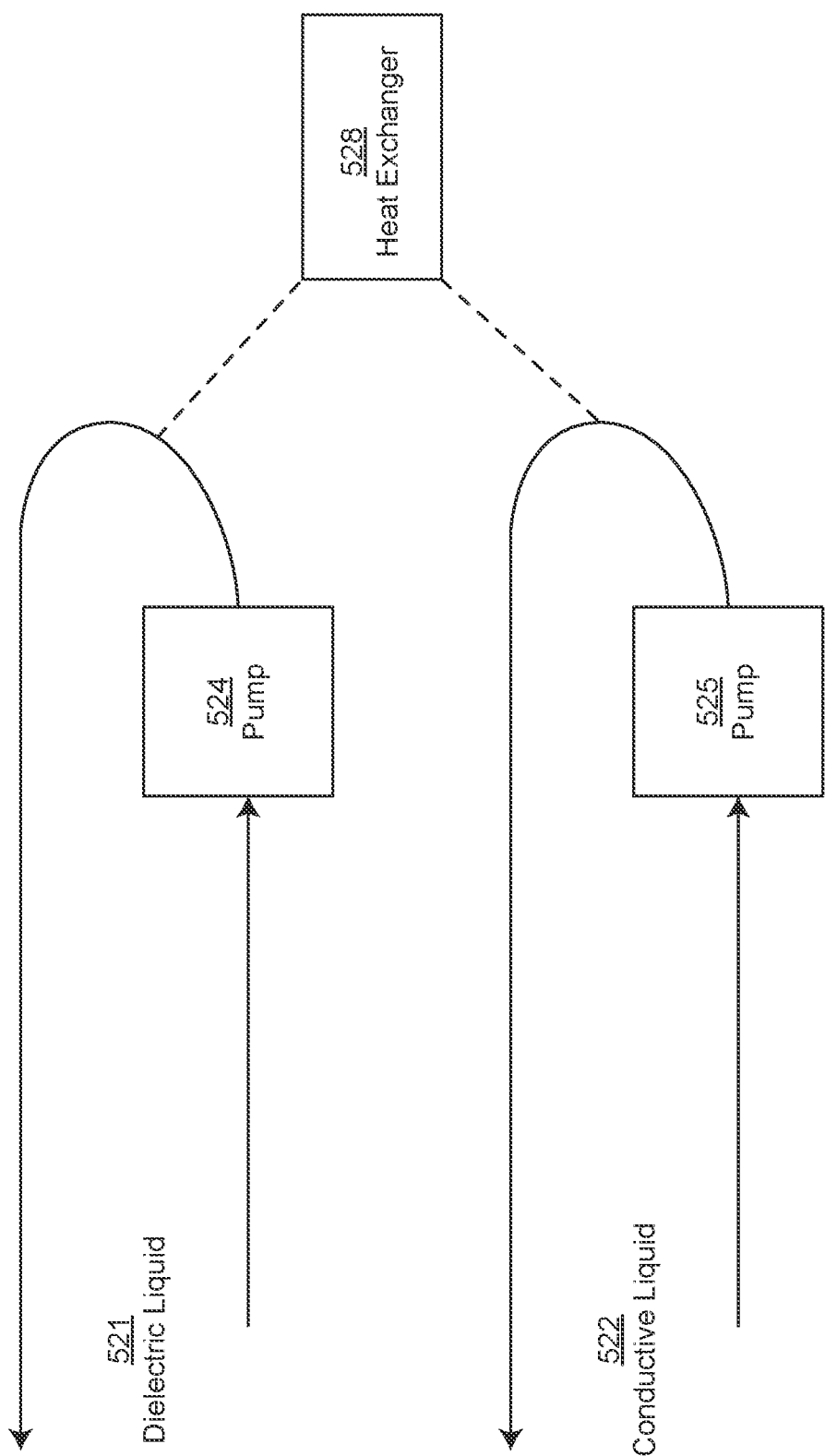
FIG. 5B is a schematic of a system suitable for circulating a dielectric liquid and a conductive liquid through a vessel, and that includes separate pumps for each liquid and a shared heat exchanger, according to some embodiments.

FIG. 5B is a schematic of a system suitable for circulating a dielectric liquid and a conductive liquid through a vessel, and that includes separate pumps for each liquid and a shared heat exchanger, according to some embodiments. In the example of FIG. 5B, the dielectric liquid 521 and conductive liquid 522 are directed to pumps 524 and 525, respectively, which each provide impulse for the respective liquid to be directed back into the vessel. A heat exchanger 528 is arranged to remove heat from both liquids as they are circulated. In some embodiments, the heat exchanger 528 may include multiple separated chambers to separately remove heat from both liquids. While the heat exchanger 528 is shown in FIG. 5B as removing heat from the liquids after they pass through the respective pumps, the heat exchanger may instead be arranged to remove heat from the liquids before they pass through the respective pump.

Figure 5C:
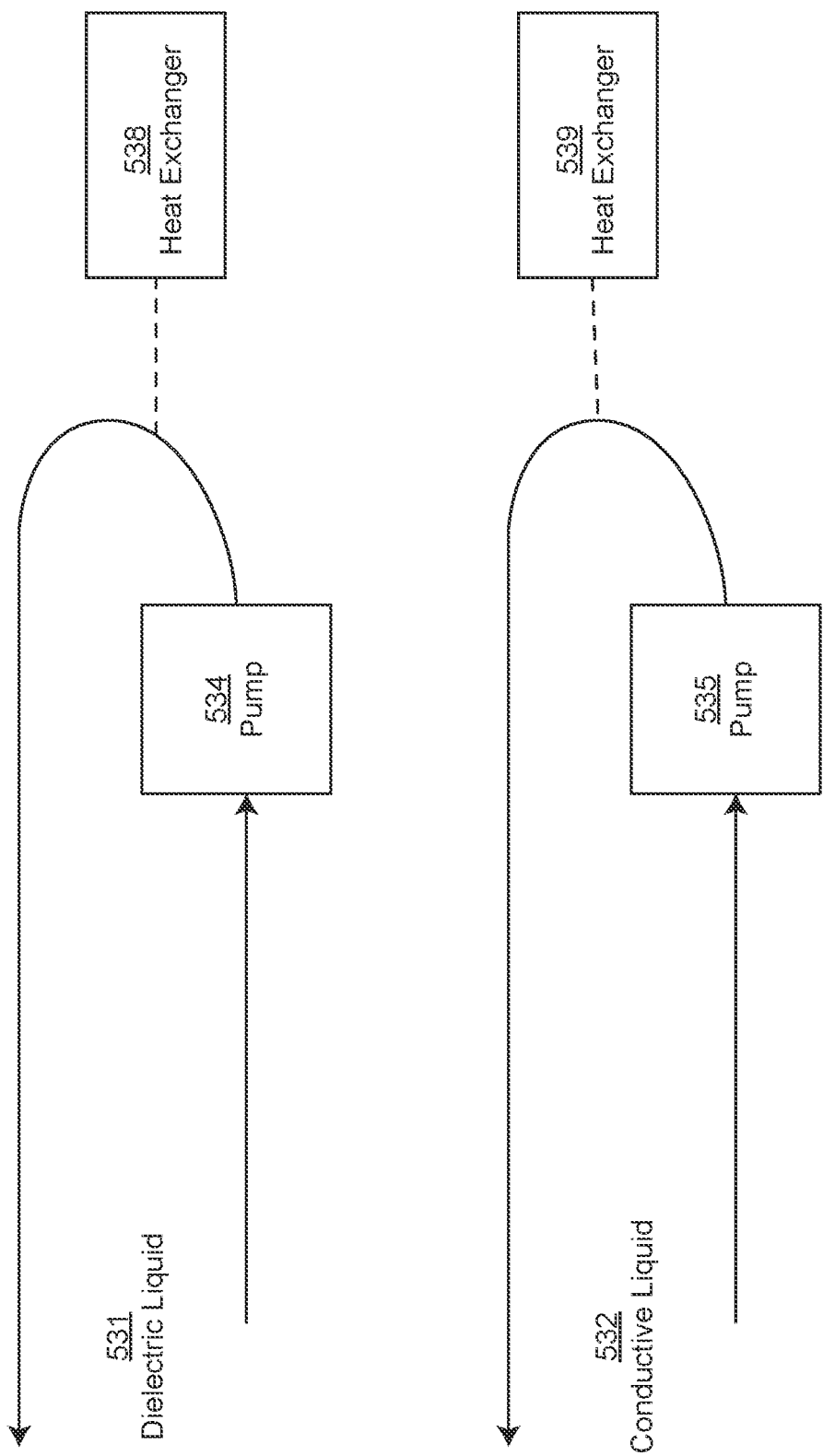
FIG. 5C is a schematic of a system suitable for circulating a dielectric liquid and a conductive liquid through a vessel, and that includes separate pumps and heat exchangers for each liquid, according to some embodiments.

FIG. 5C is a schematic of a system suitable for circulating a dielectric liquid and a conductive liquid through a vessel, and that includes separate pumps and heat exchangers for each liquid, according to some embodiments. In the example of FIG. 5C, the dielectric liquid 531 and conductive liquid 532 are directed to pumps 534 and 535, respectively, which each provide impulse for the respective liquid to be directed back into the vessel. Heat exchangers 538 and 539 are arranged to remove heat from the dielectric liquid 531 and conductive liquid 532, respectively, as each liquid is circulated. While the heat exchangers 538 and 539 are shown in FIG. 5C as removing heat from the liquids after they pass through the respective pumps, either or both heat exchangers may instead be arranged to remove heat from one of the liquids before it passes through its respective pump.

Figure 5D:
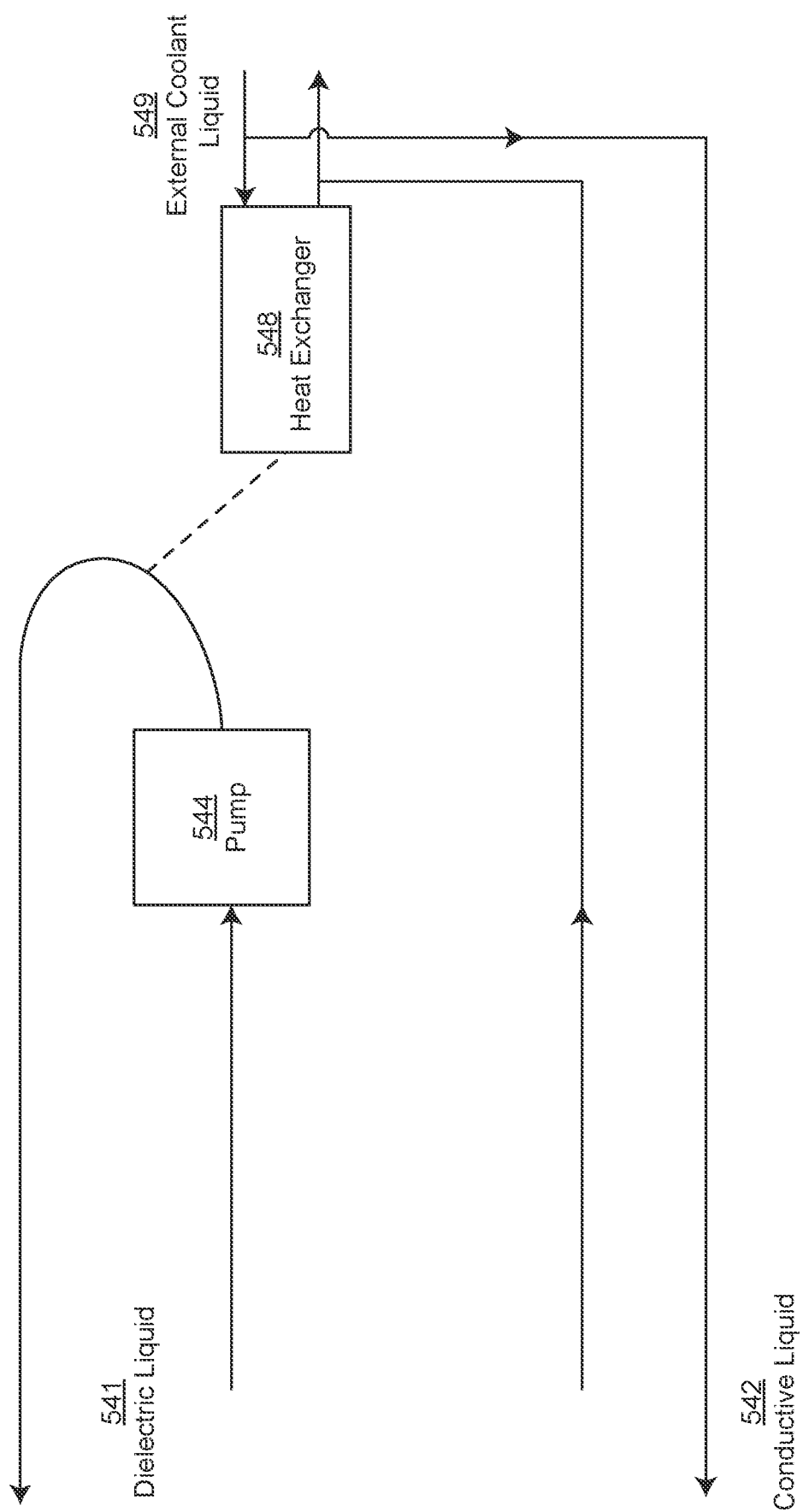
FIG. 5D is a schematic of a system suitable for circulating a dielectric liquid and a conductive liquid through a vessel, and that utilizes an external coolant as the conductive liquid and to cool the dielectric liquid, according to some embodiments.

FIG. 5D is a schematic of a system suitable for circulating a dielectric liquid and a conductive liquid through a vessel, and that utilizes an external coolant as the conductive liquid and to cool the dielectric liquid, according to some embodiments. In the example of FIG. 5D, the dielectric liquid 541 is directed to pump 544 which provides impulse for the dielectric liquid to be directed back into the vessel. A heat exchanger 548 is arranged to remove heat from the dielectric liquid 541. While the heat exchanger 548 is shown in FIG. 5D as removing heat from the dielectric liquid after it passes through the pump 544, the heat exchanger may instead be arranged to remove heat from the dielectric liquid before it passes through the pump.

In the example of FIG. 5D, the conductive liquid 542 is the same liquid uses as a coolant by the heat exchanger 548. This may, for instance, be an external source of water (e.g., external to the vessel and system shown in FIG. 5D) that is pumped into the system. This external coolant liquid 549 may be directed into the heat exchanger 548 in addition to being supplied to the fluid inlet 207a of the vessel, and may be conveyed out through the fluid outlet 207b and combined with the external coolant liquid being conveyed out of the heat exchanger 548 as shown in FIG. 5D.

The configuration of FIG. 5D may not include a coolant distribution unit (CDU), not shown, which accepts fluid from a facility water loop. The configuration of FIG. 5D may comprise a centralized (in-row) CDU supplying multiple vessels instead of a CDU for each vessel. Such a configuration (or similar) could be possible with the dielectric liquid, too.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

The above-described embodiments of the technology described herein can be implemented in any of numerous ways. Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A system comprising:
   a vessel for holding a first liquid;
   a first fluid inlet and a first fluid outlet for circulating the first liquid within the vessel;
   a plurality of electronic components arranged within the vessel;
   a cooling module arranged proximate to a first electronic component of the plurality of electronic components;
   a second fluid inlet for supplying a second liquid into the cooling module; and
   a coating on the first electronic component, the coating configured to increase the wettability of said first electronic component with respect to the second liquid.

2. The system of claim 1, further comprising a second fluid outlet for conveying the second liquid out of the vessel.

3. The system of claim 1, wherein the plurality of electronic components are mounted to a board arranged within the vessel.

4. The system of claim 1, wherein the cooling module is enclosed around the first electronic component to seal the second liquid within the cooling module and such that the second liquid may contact a surface of the first electronic component.

5. The system of claim 1, wherein the cooling module comprises one or more nozzles and is arranged proximate to, but not in contact with, the first electronic component, and wherein the one or more nozzles are arranged to direct the second liquid onto a surface of the first electronic component.

6. The system of claim 5, further comprising at least one sensor configured to monitor a level of the second liquid within the vessel.

7. The system of claim 6, wherein the at least one sensor comprises at least one capacitive sensor.

8. The system of claim 6, further comprising a first pump configured to remove the second liquid from the vessel.

9. The system of claim 7, further comprising at least one controller configured to operate the first pump based on sensor data produced by the at least one sensor.

10. The system of claim 1, wherein the first fluid inlet and first fluid outlet are formed, at least in part by walls of the vessel, and wherein circulating the first liquid within the vessel comprises conveying the first liquid into the vessel via the first fluid inlet and conveying the first liquid out of the vessel via the first fluid outlet.

11. The system of claim 1, further comprising a pump arranged within the vessel, wherein the first fluid inlet is an inlet of the pump, wherein the first fluid outlet is an outlet of the pump, and wherein circulating the first liquid within the vessel comprises conveying the first liquid into the pump via the first fluid inlet and conveying the first liquid out of the pump via the first fluid outlet.

12. The system of claim 1, further comprising the first liquid and the second liquid.

13. The system of claim 12, wherein the first liquid is a dielectric liquid and the second liquid is an electrically conductive liquid.

14. The system of claim 12, wherein the first liquid comprises an oil, or a fluorinated fluid, or a combination of oil and fluorinated fluid.

15. The system of claim 12, wherein the second liquid comprises water, or ethylene glycol, or propylene glycol, or a combination of two or more thereof.

16. The system of claim 12, wherein the first liquid, or the second liquid, or both the first liquid and the second liquid, comprises a surfactant.

17. A system comprising:
   a vessel for holding a first liquid;
   a first fluid inlet and a first fluid outlet for circulating the first liquid within the vessel;
   a plurality of electronic components arranged within the vessel;
   a cooling module arranged proximate to a first electronic component of the plurality of electronic components; and
   a second fluid inlet for supplying a second liquid into the cooling module;
   a second fluid outlet for receiving the second liquid from the cooling module and conveying the second liquid out of the vessel;
   a first heat exchanger fluidly coupled to the first fluid outlet and the second fluid outlet, the first heat exchanger arranged to transfer heat away from a mixture of the first liquid and the second liquid;
   a separation unit fluidly coupled to the first heat exchanger, the separation unit configured to
   receive the mixture from the first heat exchanger, separate the first liquid in the mixture from the second liquid in the mixture, supply the first liquid to the first fluid inlet and supply the second liquid to the second fluid inlet.

18. The system of claim 1, further comprising:
   a first pump coupled to the first fluid outlet and coupled to the first fluid inlet; and
   a second pump coupled to the second fluid outlet and coupled to the second fluid inlet.

19. The system of claim 18, further comprising a heat exchanger arranged to transfer heat away from the first liquid and to transfer heat away from the second liquid.

20. The system of claim 18, further comprising:
   a first heat exchanger arranged to transfer heat away from the first liquid; and
   a second heat exchanger arranged to transfer heat away from the second liquid.

21. A system comprising:
   a vessel for holding a first liquid;
   a first fluid inlet and a first fluid outlet for circulating the first liquid within the vessel;
   a plurality of electronic components arranged within the vessel;
   a cooling module arranged proximate to a first electronic component of the plurality of electronic components; and
   a second fluid inlet for supplying a second liquid into the cooling module;
   a second fluid outlet for receiving the second liquid from the cooling module and conveying the second liquid out of the vessel;
   a pump coupled to the first fluid outlet and coupled to the first fluid inlet; and
   a heat exchanger comprising an external fluid inlet and an external fluid outlet, the heat exchanger configured to transfer heat away from the first liquid to a third liquid, the third liquid being supplied into the heat exchanger via the external fluid inlet and conveyed out of the heat exchanger via the external fluid outlet, wherein the external fluid inlet is coupled to the second fluid inlet, and the external fluid outlet is coupled to the second fluid outlet.

22. The system of claim 1, further comprising at least one motherboard comprising the plurality of electronic components.

23. The system of claim 22, wherein the plurality of electronic components further comprises a second electronic component, wherein the first electronic component has a higher power output than the second electronic component.

24. The system of claim 1, wherein:
- a second electronic component in the plurality of electronics components is arranged within the vessel to be immersed in the first liquid; and
- a second coating on the second electronic component, the second coating configured to increase the wettability of said second electronic component with respect to the first liquid.

* * * * *